United States Patent
Nagai et al.

(10) Patent No.: US 7,011,707 B2
(45) Date of Patent: Mar. 14, 2006

(54) PRODUCTION METHOD FOR SEMICONDUCTOR SUBSTRATE AND SEMICONDUCTOR ELEMENT

(75) Inventors: Seiji Nagai, Aichi (JP); Kazuyoshi Tomita, Aichi (JP); Yoshihiro Irokawa, Aichi (JP); Kenji Ito, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/473,074

(22) PCT Filed: Mar. 27, 2002

(86) PCT No.: PCT/JP02/03026

§ 371 (c)(1),
(2), (4) Date: Jan. 8, 2004

(87) PCT Pub. No.: WO02/082517

PCT Pub. Date: Oct. 17, 2002

(65) Prior Publication Data

US 2004/0115937 A1 Jun. 17, 2004

(30) Foreign Application Priority Data

Mar. 30, 2001 (JP) .............................. 2001-99123
Mar. 30, 2001 (JP) .............................. 2001-99211

(51) Int. Cl.
*C30B 25/22* (2006.01)
(52) U.S. Cl. .................. 117/94; 117/95; 117/953; 117/93
(58) Field of Classification Search ............. 117/93, 117/94, 95, 96, 953
See application file for complete search history.

(56) References Cited

U.S. PATENT DOCUMENTS

| 5,300,186 A | * | 4/1994 | Kitahara et al. ............... 117/89 |
| 6,602,764 B1 | * | 8/2003 | Linthicum et al. .......... 438/481 |
| 2002/0031851 A1 | * | 3/2002 | Linthicum et al. ............ 438/22 |

FOREIGN PATENT DOCUMENTS

| EP | 0 647 730 A2 | 4/1995 |
| JP | 2000-277441 | 10/2000 |
| JP | 2000-357663 | 12/2000 |
| JP | 2001-176813 | 6/2001 |

* cited by examiner

*Primary Examiner*—Robert Kunemund
(74) *Attorney, Agent, or Firm*—McGinn IP Law Group, PLLC

(57) ABSTRACT

A reaction prevention layer is formed to prevent Si from reacting with a gallium nitride group semiconductor (semiconductor crystal A) which is deposited after the reaction prevention layer is formed. By forming a reaction prevention layer comprising a material whose melting point or thermal stability is higher than that of a gallium nitride group semiconductor, e.g., AlN, on a sacrifice layer, a reaction part is not formed in the semiconductor substrate deposited on the reaction prevention layer when the gallium nitride group semiconductor is grown by crystal growth for a long time. In short, owing to the effect that the reaction prevention layer prevents silicon (Si) from diffusing, the reaction part is generated only in the sacrifice layer and it is never formed at the upper portion of the reaction prevention layer even by growing the semiconductor crystal A at a high temperature for a long time.

40 Claims, 5 Drawing Sheets

PRODUCTION METHOD FOR SEMICONDUCTOR SUBSTRATE AND SEMICONDUCTOR ELEMENT

TECHNICAL FIELD

The present invention relates to a method for producing a semiconductor substrate by growing a crystal of group III nitride compound semiconductor on a base substrate comprising silicon (Si). The present invention also relates to a semiconductor device, e.g., a group III nitride compound semiconductor device, formed on such a semiconductor substrate obtained by above method.

BACKGROUND ART

FIG. 5 is a schematic cross-sectional view showing a conventional semiconductor crystal formed on a Si substrate (a base substrate) by crystal growth. MOCVD is applied in a process of crystal growth of the semiconductor crystal. As shown in FIG. 5, a semiconductor crystal (e.g. GaN crystal) grown at a high temperature on a Si substrate (base substrate) by using a conventional technique has a reaction part, dislocations and cracks.

Dislocations and cracks are occurred because of stress which is generated owing to difference of thermal expansion coefficients and difference of lattice constants between different kinds of materials. So when such a crystal growth substrate is used for fabricating each kind of semiconductor devices, the characteristics of the device is deteriorated.

When the base substrate consisting of silicon (Si) except for the grown layer is removed so as to obtain a freestanding substrate (crystal), the substrate cannot have larger area (1 cm² and bigger) because of dislocations and cracks described above.

At the temperature for crystal growth of an objective semiconductor substrate (semiconductor crystal A), or around 1000° C. to 1150° C., silicon (Si) and gallium nitride (GaN) happen to react ("reaction part" in FIG. 5). As a result, it is not easy to obtain a single crystalline GaN substrate by applying a crystal growing process in a high temperature.

A method of using a silicon thin film, which hardly generates stress described above, alone as a crystal growth substrate in order to obtain monocrystalline GaN substrate is reported. But such a thin film is easily destroyed and it is not easy to handle the thin film directly before carrying out crystal growth. Accordingly, it was difficult to manufacture semiconductor substrates each having a larger area and to obtain a higher yield rate of the semiconductor substrates by employing such conventional methods.

DISCLOSURE OF THE INVENTION

The present invention has been accomplished in order to overcome the aforementioned drawbacks. An object of the present invention is to effectively produce a semiconductor crystal of high quality having no crack or polycrystalline lump (reaction part which reacts at a high temperature) by using silicon (Si) which can be provided at comparatively low cost as a base substrate. Other object of the present invention is to produce semiconductor devices of high quality which are formed by using a high-quality semiconductor crystal as a crystal growth substrate.

The following means may be useful to overcome the above-described drawbacks.

That is, the first aspect of the present invention provides a method for producing a semiconductor substrate in which a semiconductor crystal A comprising a Group III nitride compound semiconductor is grown on a base substrate comprising silicon (Si), comprising the steps of: a sacrifice layer forming process in which a sacrifice layer comprising approximately the same kind of semiconductor as the semiconductor crystal A is formed on the base substrate by crystal growth; a reaction prevention layer forming process in which a reaction prevention layer made of a monocrystalline material B whose melting point or thermal stability is higher than that of the semiconductor crystal A and preventing silicon (Si) from diffusing is deposited on the sacrifice layer; and a crystal growth process for growing a semiconductor substrate made of the semiconductor crystal A on the reaction prevention layer by crystal growth.

Here, the semiconductor substrate comprising the semiconductor crystal A may have a single layer structure. Alternatively, it may also have a multiple layer structure.

As used herein, the term group III nitride compound semiconductor generally refers to a binary, ternary, or quaternary semiconductor having arbitrary compound crystal proportions and represented by $Al_xGa_yIn_{(1-x-y)}N$ ($0 \leq x \leq 1$, $0 \leq y \leq 1$, $0 \leq x+y \leq 1$). A semiconductor doped with p-type or n-type impurity is also included in a group III nitride compound semiconductor described in the present specification.

Group III elements (Al, Ga, In) may be partially replaced with boron (B) or thallium (Tl), and nitrogen (N) atoms may be completely or partially replaced with phosphorus (P), arsenic (As), antimony (Sb), or bismuth (Bi). Such a semiconductor may also be included in "a group III nitride compound semiconductor" in the present specification.

Examples of the aforementioned p-type impurity include magnesium (Mg) and calcium (Ca).

Examples of the aforementioned n-type impurity include silicon (Si), sulfur (S), selenium (Se), tellurium (Te), and germanium (Ge).

These impurities may be incorporated in combination of two or more species, and a p-type impurity and an n-type impurity may be incorporated in combination.

FIG. 1 illustrates a schematic cross-sectional view which explains a basic idea of a method for producing a semiconductor crystal in the present invention. A reaction prevention layer is formed to prevent Si from reacting with a gallium nitride group semiconductor (semiconductor crystal A) which is deposited after the reaction prevention layer is formed. By forming a reaction prevention layer (monocrystalline material B) comprising a material whose melting point or thermal stability is higher than that of a gallium nitride group semiconductor, e.g., SiC and AlN, on the sacrifice layer, a reaction part described above is not formed in the semiconductor substrate (semiconductor crystal A) deposited on the reaction prevention layer when the gallium nitride group semiconductor (semiconductor crystal A) is grown by crystal growth for a long time.

In short, owing to the effect that the reaction prevention layer prevents silicon (Si) from diffusing, the reaction part is generated only in the sacrifice layer and it is never formed at the upper portion of the reaction prevention layer even by growing the semiconductor crystal A at a high temperature for a long time.

By generating the reaction part in the sacrifice layer intentionally, a semiconductor layer comprising a polycrystalline GaN (high temperature reaction part made of polycrystalline lump) is formed between the silicon (Si substrate) and the reaction prevention layer. As a result, after the reaction part is formed, stress which acts to the reaction prevention layer is relaxed and hardly functions so as to form a crack on the reaction prevention layer. As a result, cracks which penetrate the reaction prevention layer in longitudinal direction are hardly generated. And because the base substrate (Si substrate) and the gallium nitride group semiconductor (semiconductor crystal A) can be completely interrupted by the reaction prevention layer having no cracks which penetrate in longitudinal direction, generation of the above-described reaction part in the semiconductor substrate (semiconductor crystal A) can be prevented more securely.

Owing to the polycrystalline lump, stress caused between the base substrate and the semiconductor substrate is relaxed. That enables to decrease unnecessary stress which acts to a growing semiconductor substrate when the semiconductor substrate (objective semiconductor crystal A) is grown by crystal growth, to thereby reduce generation of dislocations and cracks.

Owing to the stress relaxing action described above, dislocations hardly occurs in the gallium nitride group semiconductor (semiconductor crystal A), and generation of cracks can be remarkably reduced.

Further, because the reaction part described above is made of polycrystalline lump of GaN, the reaction part is structurally weak and fragile, and has a small endurance toward external force and inner stress. Accordingly, an objective semiconductor substrate can be easily separated from the base substrate (Si substrate) at the sacrifice layer comprising the reaction part.

According to those actions and their synergism, it becomes possible or easier to obtain a semiconductor substrate (semiconductor crystal A) of high quality whose dislocation concentration is sufficiently controlled and which does not have reaction part and cracks.

The second aspect is drawn to a method of the first aspect, wherein the semiconductor crystal A comprises a group III nitride compound semiconductor having a composition of $Al_xGa_yIn_{(1-x-y)}N$ ($0 \leq x < 0.9$, $0.1 < y \leq 1$, $0 < x+y \leq 1$).

The third aspect is drawn to a method of the first or second aspect, wherein at least one of silicon carbide (SiC), aluminum nitride (AlN), and spinel ($MgAl_2O_4$) is used as monocrystalline material B forming the reaction prevention layer.

The fourth aspect is drawn to a method of the first or second aspect, wherein AlGaN, AlInN, or AlGaInN, in which aluminum composition ratio is at least 0.30 or more, is used as monocrystalline material B forming the reaction prevention layer.

Further, a material having comparatively strong interatomic binding energy, high thermal stability (fusing point) and high stability may be preferably employed as monocrystalline material B.

The fifth aspect is drawn to a method according to any one of the first to fourth aspects, wherein thickness of the reaction prevention layer is in a range of 0.1 μm to 2 μm. More preferably, thickness of the reaction prevention layer is in a range of 0.5 μm to 1.5 μm.

When the thickness of each reaction prevention layer is too small, because the thickness is not uniform and the monocrystalline material B is not a material with sufficient stability, gallium (Ga) or gallium nitride (GaN) and silicon (Si) cannot be completely interrupted. As a result, formation of reaction part (poly-crystalline GaN) may not be prevented sufficiently.

When the thickness of each reaction prevention layer is too large, cracks tends to be generated in the reaction prevention layer, and gallium (Ga) or gallium nitride (GaN) and silicon (Si) in the semiconductor crystal A (semiconductor substrate) formed thereon cannot be completely interrupted. As a result, formation of reaction part may not be prevented sufficiently, to thereby generate the reaction part in the semiconductor substrate (the upper layer semiconductor crystal A).

When the thickness of each reaction prevention layer is too large, more time and materials are needed to deposit the reaction prevention layer, to thereby unfavorably increase the production cost of the device.

The sixth aspect is drawn to a method according to any one of the first to fifth aspects, wherein two or more reaction prevention layers are deposited. By depositing plural numbers of reaction prevention layers, diffusing of silicon can be prevented more securely. As a result, generation of reaction part can be prevented more securely.

The seventh aspect is drawn to a method according to any one of the first to sixth aspects, wherein a buffer layer C made of $Al_xGa_{1-x}N$ ($0 < x \leq 1$) is formed directly on the base substrate or the reaction prevention layer.

Here the buffer layer C is a semiconductor layer made of AlN or AlGaN which grows at the temperature around 1100° C. Alternatively, aside from the buffer layer C, a middle layer (it may be called just "a buffer layer" hereinafter) having almost the same compositions as those of the buffer layer C (e.g., AlN and AlGaN) may be further formed in the semiconductor substrate (semiconductor crystal A) periodically, alternatively with other layers, or deposited so that the middle layer has a multiple layer structure.

By depositing such a buffer layer (or a middle layer), stress caused by difference of lattice constants and acting to the semiconductor crystal A may be relaxed by the same action principle as that of the conventional one. As a result, crystallinity of the device is improved.

Such action and effect may be seen remarkable especially when the monocrystalline material B constructing the reaction prevention layer is such as silicon carbide (SiC). In short, it is more preferable at this time to form the buffer layer C on the reaction prevention layer.

The eighth aspect is drawn to a method according to the seventh aspect, wherein two or more buffer layers C are laminated. For example, two buffer layers C are formed in total on each upper surface of the base substrate (Si substrate) and the reaction prevention layer. By employing multiple layer structure of the buffer layers, action and effect as in the seventh aspect can be obtained more securely.

The ninth aspect is drawn to a method according to the seventh or eighth aspect, wherein the buffer layer C is formed to have thickness of 0.01 μm to 1 μm. More preferably, thickness of the buffer layer C is in a range of 0.02 μm to 0.5 μm.

When thickness of the buffer layer C is too large, cracks tend to be generated in the buffer layer and more production time and materials are needed. That is not favorable to the production cost of the device. When the buffer layer C is too thin, it becomes difficult to form the buffer layer to have almost uniform thickness. As a result, the buffer layer becomes to have ununiform thickness (or a portion where it is not grown adequately), crystallinity of the buffer layer tends to be ununiform, and that is not desirable.

The tenth aspect is drawn to a crystal growing process according to any one of the first to ninth aspects, wherein the semiconductor crystal A is deposited to have a thickness of 50 μm or more.

The larger thickness of the semiconductor crystal A is, the more tensile stress to the semiconductor substrate (semiconductor crystal A) is relaxed. That decreases generation of dislocations and cracks in the semiconductor substrate and at the same time strengthen the semiconductor substrate. As a result, it becomes easier to handle it as a semiconductor substrate.

The eleventh aspect is drawn to a group III nitride compound semiconductor device comprising the semiconductor crystal which is formed by the method of any one of the first to tenth aspects as a crystal growth substrate.

Accordingly, a group III nitride compound semiconductor device, e.g., a light-emiting device such as an LED or a transistor circuit such as an FET, made of a semiconductor which has excellent crystallinity and less inner stress can be obtained or easily produced.

The twelfth aspect is to form a group III nitride compound semiconductor device by employing crystal growth in which a semiconductor crystal manufactured by the method of any one of the first to tenth aspects functions as a crystal growth substrate.

As a result, a group III nitride compound semiconductor device made of a semiconductor which has excellent crystallinity and less inner stress can be obtained or easily manufactured.

Through employment of the aforementioned aspects of the present invention, the aforementioned drawbacks can be overcome effectively and rationally.

That is, the thirteenth aspect of the present invention provides a method for producing a semiconductor substrate in which a semiconductor crystal A comprising a Group III nitride compound semiconductor is grown on a base substrate comprising silicon (Si), comprising the steps of: a thin film part forming process in which a thin film part comprising silicon (Si) is formed as a crystal growth front of the base substrate by forming a cavity right under the crystal growth front of the base substrate; a reaction prevention layer forming process in which a reaction prevention layer made of a monocrystalline material B whose melting point or thermal stability is higher than that of the semiconductor crystal A is deposited on the thin film part; and a crystal growing process for growing the semiconductor crystal A on the reaction prevention layer by crystal growth.

Here, the semiconductor substrate comprising the semiconductor crystal A may have a single layer structure. Alternatively, it may also have a multiple layer structure.

As used herein, the term group III nitride compound semiconductor generally refers to a binary, ternary, or quaternary semiconductor having arbitrary compound crystal proportions and represented by $Al_xGa_yIn_{(1-x-y)}N$ ($0 \leq x \leq 1$, $0 \leq y \leq 1$, $0 \leq x+y \leq 1$). A semiconductor doped with p-type or n-type impurity is also included in a group III nitride compound semiconductor described in the present specification.

Group III elements (Al, Ga, In) may be partially replaced with boron (B) or thallium (Tl), and nitrogen (N) atoms may be completely or partially replaced with phosphorus (P), arsenic (As), antimony (Sb), or bismuth (Bi). Such a semiconductor may also be included in "a group III nitride compound semiconductor" in the present specification.

Examples of the aforementioned p-type impurity include magnesium (Mg) and calcium (Ca).

Examples of the aforementioned n-type impurity include silicon (Si), sulfur (S), selenium (Se), tellurium (Te), and germanium (Ge).

These impurities may be incorporated in combination of two or more species, and a p-type impurity and an n-type impurity may be incorporated in combination.

FIG. 2 illustrates a schematic cross-sectional view which explains a basic idea of a method for producing a semiconductor crystal in the present invention. A reaction prevention layer is formed to prevent Si from reacting with a gallium nitride group semiconductor (semiconductor crystal A). By forming a reaction prevention layer (monocrystalline material B) comprising a material whose melting point or thermal stability is higher than that of a gallium nitride group semiconductor (semiconductor crystal A), e.g., SiC and AlN, on a base substrate (Si substrate), a reaction part described above is not formed around silicon interface when the gallium nitride group semiconductor (semiconductor crystal A) is grown by crystal growth for a long time.

By forming a cavity, a thin film is formed at the side of the crystal growth front of the silicon (Si substrate), stress which acts to the reaction prevention layer is relaxed, and hardly functions so as to form a crack on the reaction prevention layer in longitudinal direction. As a result, cracks which penetrate the reaction prevention layer in longitudinal direction are hardly generated. And because the base substrate (Si substrate) and the gallium nitride group semiconductor (semiconductor crystal A) can be completely interrupted by the reaction prevention layer having no cracks which penetrate in longitudinal direction, generation of the above-described reaction part can be prevented more securely.

Owing to the thin film part and the cavity, stress caused by the difference of lattice constants of the base substrate and the semiconductor substrate is relaxed. That enables to decrease unnecessary stress which acts to a growing semiconductor substrate when the semiconductor substrate (objective semiconductor crystal A) grows by crystal growth, to thereby reduce generation of dislocations and cracks.

Owing to the stress relaxing action described above, dislocations hardly occurs in the gallium nitride group semiconductor (semiconductor crystal A), and generation of cracks can be remarkably reduced.

According to those actions and their synergism, it becomes possible or easier to obtain a semiconductor substrate (semiconductor crystal A) of high quality whose dislocation concentration is sufficiently suppressed and which does not have reaction part and cracks.

The fourteenth aspect is drawn to a method of the thirteenth aspect, wherein the semiconductor crystal A comprises a group III nitride compound semiconductor having a composition of $Al_xGa_yIn_{(1-x-y)}N$ ($0 \leq x < 1$, $0 < y \leq 1$, $0 < x+y \leq 1$).

The fifteenth aspect is drawn to a method of the thirteenth or fourteenth aspect, wherein at least one of silicon carbide (SiC), aluminum nitride (AlN), and spinel ($MgAl_2O_4$) is used as monocrystalline material B forming the reaction prevention layer.

The sixteenth aspect is drawn to a method of the thirteenth or fourteenth aspect, wherein AlGaN, AlInN, or AlGaInN, in which aluminum composition ratio is at least 0.30 or more, is used as monocrystalline material B forming the reaction prevention layer.

Further, a material having comparatively strong interatomic binding energy, high thermal stability (fusing point) and high stability may be preferably employed as monocrystalline material B.

The seventeenth aspect is drawn to a method according to any one of the thirteenth to sixteenth aspects, wherein thickness of the reaction prevention layer is in a range of 0.1 $\mu$m to 2 $\mu$m.

When the thickness of each reaction prevention layer is too small, because the thickness is not uniform and the monocrystalline material B is not a material with sufficient stability, gallium (Ga) or gallium nitride (GaN) and silicon (Si) cannot be completely interrupted. As a result, formation of reaction part (poly-crystalline GaN) may not be prevented sufficiently.

When thickness of each reaction prevention layer is too large, cracks tends to be generated in the reaction prevention layer, and gallium (Ga) or gallium nitride (GaN) and silicon (Si) cannot be completely interrupted. As a result, formation of reaction part may not be prevented sufficiently.

When the thickness of each reaction prevention layer is too large, more time and materials are needed to deposit the reaction prevention layer, to thereby unfavorably increase the production cost of the device.

The eighteenth aspect is drawn to a reaction prevention layer forming process according to any one of the thirteenth to seventeenth aspects, wherein a buffer layer C made of $Al_xGa_{1-x}N$ ($0<x\leq1$) is formed on the reaction prevention layer after said reaction prevention layer forming process.

Here the buffer layer C is a semiconductor layer made of AlN or AlGaN which grows at the temperature around 1100° C. Alternatively, aside from the buffer layer C, a middle layer (it may be called just "a buffer layer" hereinafter) having almost the same compositions as those of the buffer layer C (e.g., AlN and AlGaN) may be further formed in the semiconductor substrate (semiconductor crystal A) periodically, alternatively with other layers, or deposited so that the middle layer has a multiple layer structure.

By depositing such a buffer layer (or a middle layer), stress caused by difference of lattice constants and acting to the semiconductor crystal A may be relaxed by the same action principle as that of the conventional one. As a result, crystallinity of the device is improved.

Such action and effect may be seen remarkable especially when the monocrystalline material B constructing the reaction prevention layer is such as silicon carbide (SiC). In short, it is more preferable at this time to form the buffer layer C on the reaction prevention layer.

The nineteenth aspect is drawn to a method according to the eighteenth aspect, wherein the buffer layer C is formed to have thickness of 0.01 μm to 1 μm. More preferably, thickness of the buffer layer C is in a range of 0.02 μm to 0.5 μm.

When thickness of the buffer layer C is too large, cracks tend to be generated in the buffer layer C and more production time and materials are needed. That is not favorable to the production cost of the device. When the buffer layer C is too thin, it becomes difficult to form the buffer layer to have almost uniform thickness. As a result, the buffer layer becomes to have ununiform thickness (or a portion where it is not grown properly), crystallinity of the buffer layer tends to be ununiform, and that is not desirable.

The twentieth aspect is drawn to a method according to any one of the thirteenth to nineteenth aspects, further comprising a separation process for separating the semiconductor crystal A and the base substrate, wherein stress owing to differences of thermal expansion coefficients is generated by cooling or heating the substrate crystal A and the base substrate, and sidewalls of the cavities are broken by using the stress.

For example, when the semiconductor substrate (semiconductor crystal A) is formed to have a sufficient thickness, inner stress or outer stress becomes easy to act intensively to the sidewalls of the cavities. As a result, especially these stress function as shearing stress toward the sidewalls of cavities. When the shearing stress becomes larger, the thin film part ruptures.

Accordingly, the base substrate and the semiconductor substrate can be easily separated by applying the stress. The larger the cavity is, the more easily stress (shearing stress) concentrates to sidewalls of the cavity.

In short, according to the twentieth aspect described above, the semiconductor crystal A and the base substrate can be easily separated because it becomes easy to generate stress.

When the base substrate and the semiconductor substrate are separated (exfoliated), a part of the base substrate (e.g., rupture remains of the thin film part or sidewalls of the cavity) may remain on the semiconductor substrate side. That is, this separation process does not necessarily require complete or perfect separation of each material with no remains.

Such rupture remains may be removed by using conventional methods such as wrapping and etching if necessary.

The twenty-first aspect is drawn to the crystal growing process according to any one of the thirteenth to twentieth aspects, wherein the semiconductor crystal A is deposited to have a thickness of 50 μm or more.

The larger thickness of the semiconductor crystal A is, the more tensile stress to the semiconductor substrate (semiconductor crystal A) is relaxed. That decreases generation of dislocations and cracks in the semiconductor substrate and at the same time strengthen the semiconductor substrate. As a result, it becomes easier to concentrate the stress to sidewalls of the cavity.

Preferably, thickness of the thin film part is 20 μm or less. The smaller this thickness is, the more the tensile stress to the semiconductor substrate (semiconductor crystal A) is relaxed. That results in decreasing generation of dislocations and cracks in the semiconductor substrate. But when thickness of the thin film part is less than 0.02 μm, a problem takes place in absolute strength of the thin film part itself, and high productivity of the device cannot be maintained. So in order to keep the quality and the productivity of the crystal growth substrate, the thin film part may preferably have thickness in a range of 0.02 μm to 20 μm.

Relatively, it is preferable that thickness of an objective semiconductor crystal which is formed by crystal growth is approximately the same or larger than that of the thin film part. By employing such condition, it becomes easier to relax stress toward the objective semiconductor crystal, to thereby control generation of dislocations and cracks in the semiconductor crystal more remarkably compared with a conventional invention. This stress relaxing effect grows larger according to that thickness of the objective semiconductor crystal growth relatively thicker. Although it depends on conditions such as thickness of the thin film part, this stress relaxing effect is almost saturated with about 50 μm to 200 μm of the objective grown semiconductor crystal when thickness of the thin film part is 20 μm or less.

The twenty-second aspect is drawn to a thin film part forming process according to any one of the thirteenth to twenty-first aspects, further comprising a concave part forming process in which a cavity whose top is opened is formed in silicon crystal comprising the base substrate through physical or chemical etching treatment is carried out and then a cavity and the thin-film part are formed by migration function around the surface of the substrate owing to heat treatment at a temperature of 1000° C. to 1350° C.

The twenty-third aspect is drawn to a thin film part forming process according to any one of the thirteenth to twenty-first aspects, the thin film part forming process comprising: an ion injecting process in which ion is injected into the silicon crystal forming the thin film part; a concave part forming process in which a cavity whose top is opened is formed in the silicon crystal comprising the base substrate except for the thin film part through physical or chemical etching treatment; a junction process in which the thin film part is joined to the cavity part through heat treatment; and an exfoliating process in which the thin film part is exfoliated at an ion injection part functioning as a separation front.

At least the thin film part forming process in the present invention can be or is easily carried out adequately and concretely according to the twenty-second and twenty-third aspects. Here the thin film part forming process in the present invention is not necessarily limited thereto, but it may be carried out by employing appropriate method. That is, actions and effects of the present invention may be obtained properly or more than that by employing such method.

The twenty-fourth aspect is drawn to a thin film part forming process according to any one of the thirteenth to twenty-third aspects, wherein height of the cavity is 0.1 μm to 10 μm. More preferably, height of the cavity may be 0.5 μm to 5 μm.

When height of the cavity is too large, strength of each pillar which supports a hole, a groove or a cavity becomes unstable or processing the pillars gradually becomes difficult and inefficient. That is not desirable. Also that makes processing time of the device longer, to thereby delay its productivity.

When height of the cavity is too small, thin film part tends to join with the bottom surface of the cavity, and cavities cannot be obtained securely. That is not desirable.

The twenty-fifth aspect is drawn to a group III nitride compound semiconductor device comprising the semiconductor crystal which is formed by the method of any one of the thirteenth to twenty-fourth aspects as a crystal growth substrate.

Accordingly, a group III nitride compound semiconductor device made of a semiconductor which has excellent crystallinity and less inner stress can be obtained or easily produced.

The twenty-sixth aspect is to form a group III nitride compound semiconductor device by employing crystal growth in which a semiconductor crystal manufactured by the method of any one of the thirteenth to twenty-fourth aspects functions as a crystal growth substrate.

As a result, a group III nitride compound semiconductor device made of a semiconductor which has excellent crystallinity and less inner stress can be obtained or easily produced.

Through employment of the aforementioned aspects of the present invention, the aforementioned drawbacks can be overcome effectively and rationally.

BEST MODE FOR CARRYING OUT THE INVENTION

Figure 1:
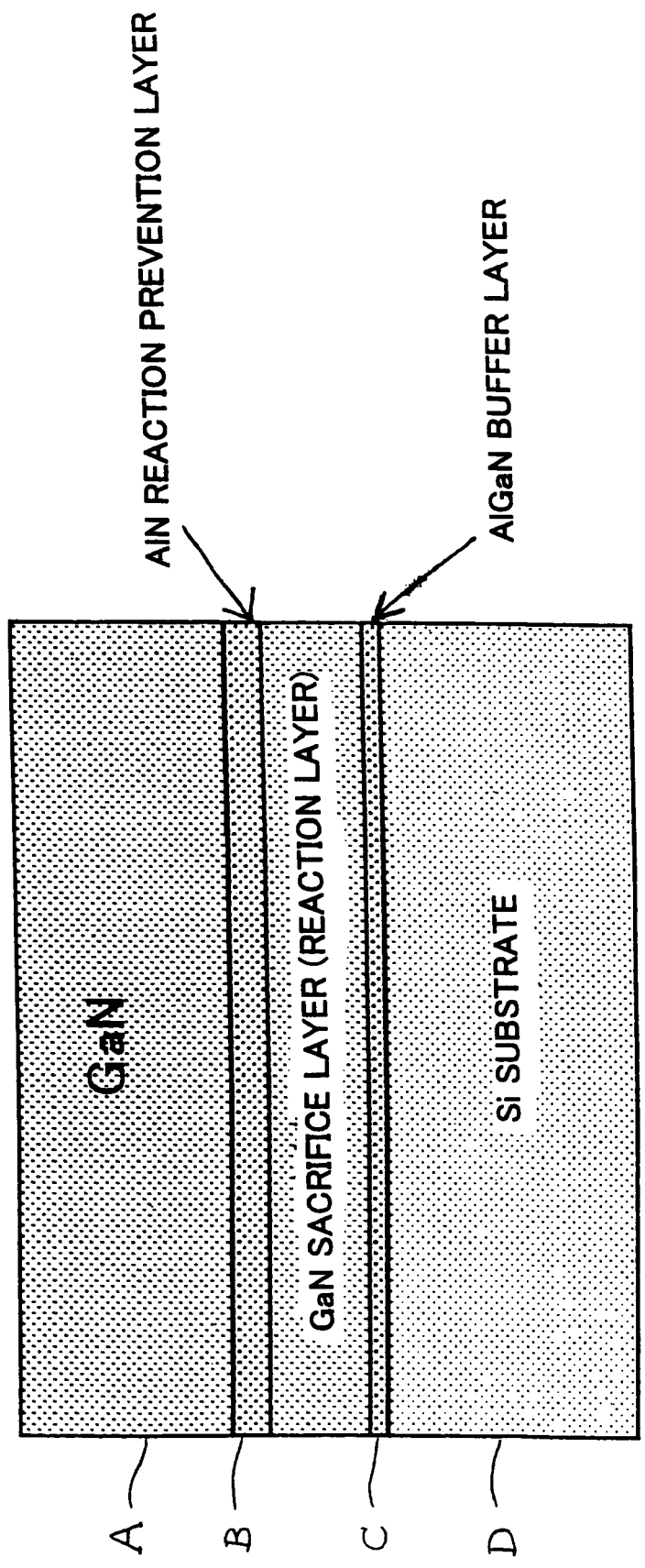
FIG. 1 is a schematic sectional view showing a method for producing a semiconductor crystal according to the first feature of the present invention.

Embodiments of the present invention will next be described with reference to the drawings. Characteristic features of the present invention which have been described above is also the best mode for carrying out the invention, and the present invention is not limited to the below-described specific embodiments.

On carrying out the present invention, each producing condition may be chosen from the followings. Also each producing condition may be combined arbitrary with each other.

Firstly, Group III nitride compound semiconductor layers are preferably formed through metal-organic vapor phase growth (MOCVD or MOVPE). Other growth methods, such as molecular-beam epitaxy (MBE), halide vapor phase growth (halide VPE), and liquid phase growth (LPE), may also be employed. Moreover, the respective layers may be formed through different methods.

Preferably, a buffer layer is appropriately provided in the crystal growth substrate or formed on such as the base substrate, for several reasons, such as compensation of lattice mismatch.

Particularly, when the buffer layer (intermediate layer) is provided in the semiconductor substrate (the substrate crystal A), the buffer layer is preferably formed from a Group III nitride compound semiconductor $Al_xGa_yIn_{1-x-y}N$ ($0 \leq x \leq 1$; $0 \leq y \leq 1$; $0 \leq x+y \leq 1$) which is formed at low temperature, more preferably $Al_xGa_{1-x}N$ ($0 \leq x \leq 1$). The buffer layer may be a single layer or a multi-layer comprising a plurality of sub layers of different compositions. The buffer layer may be formed at a low temperature (380–420° C.), or may be formed at 1000–1180° C. through MOCVD. Alternatively, a buffer layer comprising AlN may be formed through reactive sputtering by use of a DC magnetron sputtering apparatus, from high-purity metallic aluminum and nitrogen gas serving as raw materials.

The buffer layer comprising a compound semiconductor represented by formula $Al_xGa_yIn_{1-x-y}N$ ($0 \leq x \leq 1$; $0 \leq y \leq 1$; $0 \leq x+y \leq 1$; arbitrary compositional proportions) can be formed through physical vapor deposition such as vapor deposition, ion plating, laser ablation, or ECR. The buffer layer is preferably formed through physical vapor deposition at 200–600° C., more preferably 300–600° C., most preferably 350–450° C. The buffer layer which is formed through physical vapor deposition such as sputtering preferably has a thickness of 100–3,000 Å, more preferably 100–400 Å, most preferably 100–300 Å.

A buffer layer of multi-layer type is formed through any of several methods. For example, an $Al_xGa_{1-x}N$ ($0 \leq x \leq 1$) layer and a GaN layer are alternately formed, or a semiconductor layer of the same composition is alternately formed at different temperatures, such as 600° C. or lower and 1000° C. or higher. These two methods may be employed in combination. The multi-layer buffer layer may be formed by stacking at least three species selected from Group III nitride compound semiconductors represented by $Al_xGa_yIn_{1-x-y}N$ ($0 \leq x \leq 1$; $0 \leq y \leq 1$; $0 \leq x+y \leq 1$). Generally, a buffer layer is made of non-crystal and an intermediate layer is made of monocrystalline. Repetitions of unit of a buffer layer and an intermediate layer may be formed, and the number of repetitions is not particularly limited. The larger the number of repetitions are, the greater the improvement in crystallinity becomes.

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms.

In this case, since acceptor impurities easily occupy the sites of Group III atoms, p-type crystals can be obtained as grown. Through the thus-attained improvement of crystallinity combined with the features of the present invention, threading dislocation can be further reduced to approximately 1/100 to 1/1000. In the case of an underlying layer containing two or more repetitions of a buffer layer and a Group III nitride compound semiconductor layer, the Group III nitride compound semiconductor layers are further preferably doped with an element greater in atomic radius than a predominant component element. When a light-emitting element is produced, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Dislocations occurring in a Group III nitride compound semiconductor layer can also be reduced through employment of lateral epitaxial growth. In this case, lateral epitaxial growth can be performed in an arbitrary manner; e.g., by use of a mask or through employment of etching for leveling a step and supplying the step as seed for executing ELO between steps.

The aforementioned etching mask may be formed from a polycrystalline semiconductor such as polycrystalline silicon or polycrystalline nitride semiconductor; an oxide or nitride such as silicon oxide ($SiO_x$), silicon nitride ($SiN_x$), titanium oxide ($TiO_x$), or zirconium oxide ($ZrO_x$); or a high-melting-point metal such as titanium (Ti) or tungsten (W). A multi-layer film of these materials may also be employed. The film can be formed through any film formation method such as vapor phase growth (e.g., vapor deposition, sputtering, or CVD).

Although reactive ion beam etching (RIBE) is a preferred etching method, any other etching method can also be employed. A step having a surface of a side wall which is not normal to the substrate plane may be formed. For example, a step which does not have a flat surface on the bottom of the substrate and which has a V-shape cross-section may be formed through anisotropic etching.

A semiconductor device, such as an FET or a light-emitting device, can be formed on the aforementioned Group III nitride compound semiconductor. In the case where a light-emitting device is formed, a light-emitting layer may have a multi-quantum well (MQW) structure, or a single-quantum well (SQW) structure, and the device may have a homo-structure, a single-hetero-structure, or a double-hetero-structure, or the layer may be formed by means of, for example, a pin junction or a pn junction.

Embodiments of the present invention will next be described. The present invention is not limited to the embodiments described below.

(First Embodiment)

In the following Example, a method for producing a semiconductor crystal (crystal growth substrate) according to a first embodiment of the present invention will be described.

[1] Buffer Layer Forming Process

First, about 0.2 $\mu$m to 0.3 $\mu$m in thickness of $Al_xGa_{1-x}N$ ($x \approx 0.20$) buffer layer C is formed at a temperature of about 1100° C. through metal organic vapor phase epitaxy (MOVPE) on a Si (111) substrate.

[2] Sacrifice Layer Growing Process

Next, about 1 $\mu$m in thickness of GaN is formed as a sacrifice layer at a temperature of about 1100° C. through vapor phase growth (MOVPE).

[3] Reaction Prevention Layer Forming Process

In this reaction prevention layer forming process, a reaction prevention layer is deposited on the above described sacrifice layer.

In this process, about 1 $\mu$m in thickness of aluminum nitride (AlN) reaction prevention layer B is formed on the sacrifice layer at a temperature of about 1100° C. through vapor phase growth (MOVPE).

[4] Crystal Growing Process

In the crystal growing process, a semiconductor crystal A (GaN) is grown on the reaction prevention layer B to have thickness of about 200 $\mu$m through halide vapor phase growth (HVPE).

That is, about 200 $\mu$m in thickness of GaN layer (semiconductor crystal A) is grown on the reaction prevention layer B through halide vapor phase growth (HVPE). Crystal growth velocity of the GaN layer 102b though HVPE was about 45 $\mu$m/Hr.

[5] Separating Process (a) After the crystal growing process, the wafer comprising the base substrate (Si substrate) was cooled to ambient temperature under conditions of supplying ammonia ($NH_3$) gas to a reaction chamber of the crystal growth apparatus. Here velocity of cooling the layers was about −50° C./min to −5° C./min.

(b) The wafer comprising the base substrate (Si substrate) was taken from the reaction chamber of the crystal growth apparatus, and then GaN crystal (semiconductor crystal A) exfoliated (or peeled off) from the base substrate (Si substrate) was obtained. Here the crystal obtained through this process was the GaN layer (semiconductor substrate) on whose back surface remains of the sacrifice layer and the reaction prevention layer each comprising a reaction part were left.

[6] Remains Removing Process

After carrying out the above separating process, rupture remains of the sacrifice layer and the reaction prevention layer each of which comprised a reaction part and was remaining on the back surface of the GaN crystal were removed through wrapping process.

Here this removing process may be carried out through etching treatment using a mixture of hydrofluoric acid and nitric acid. When the reaction prevention layer B has enough conductivity, the reaction prevention layer B may not be removed. For example, whether to carry out the remains removing process or not can be selected according to conditions such as the structure of electrode connection of the light-emitting semiconductor device.

Accordingly, a GaN crystal (GaN layer 102b) having thickness of about 200 μm and excellent crystallinity, which is a desired free-standing semiconductor substrate independent from the base substrate 101, was obtained through the method described above.

By employing this method for producing a semiconductor crystal, a single crystalline gallium nitride (GaN) which has more excellent crystallinity than that of a conventional one and has no GaN polycrystalline (reaction part) or no crack can be obtained.

Accordingly, by employing such an excellent single crystalline to a portion of a semiconductor light-emitting device, e.g., to a crystal growth substrate, it becomes possible or easier to produce a semiconductor product, e.g., a semiconductor light-emitting device and a semiconductor light-receiving device, which has a high luminous efficiency and whose driving voltage is more decreased compared with a conventional device.

Also, by employing such an excellent single crystalline, it becomes possible or easier to produce not only a luminous device but also semiconductor electron device such as a semiconductor power device having a high voltage-withstand-characteristic and a semiconductor high-frequency device which works to a high frequency.

Alternatively, in order to correct lattice constant mismatch, a buffer layer forming process in which crystal growth is carried out at a high temperature of 1000° C. to 1180° C. may be further employed between the reaction prevention layer forming process and the crystal growth process.

Alternatively, materials such as $Al_xGa_{1-x}N$ (0<x<1) may be used as monocrystalline material B for forming the reaction prevention layer. Approximately same action and effect as in this embodiment may be obtained by employing such monocrystalline material B.

More generally, silicon carbide (SiC), aluminum nitride (AlN), spinel ($MgAl_2O_4$), or AlGaN, AlInN and AlGaInN whose aluminum composition ratio is at least 0.30 and more may be used as monocrystalline material B for forming the reaction prevention layer.

The semiconductor crystal A which forms an objective semiconductor substrate is not limited to gallium nitride (GaN) but may be selected from the above-mentioned group III nitride compound semiconductor.

Alternatively, the objective semiconductor substrate (semiconductor crystal A) may have a multiple layer structure.

For example, growth temperature of the semiconductor crystal A constituting the objective semiconductor substrate may be raised in halfway of its growing process and a semiconductor layer grown at higher temperature may be formed at the upper portion (upper layer). As a result, the same action and effect as in the present invention may be obtained by forming the semiconductor layer having multiple layer structure or by forming a middle layer such as a buffer layer in the multiple layer structure.

Further, materials of "a sacrifice layer" may not be necessarily the same as those of the objective semiconductor substrate (semiconductor crystal A). The materials of "a sacrifice layer" may also be arbitrary selected among the above-mentioned general "Group III nitride compound semiconductor."

In short, kinds (materials) of the sacrifice layer and the objective semiconductor crystal are not particularly limited in the present invention, and the present invention can be applied to well-known or arbitrary kind of hetero-epitaxial growth on the base substrate (Si substrate) described above.

In the above embodiment, metal-organic vapor phase epitaxly (MOVPE) is employed in the above embodiment. Alternatively, crystal growth of the present invention may be carried out through halide vapor phase growth (HVPE).

Further, in the above embodiment, the semiconductor crystal A is employed as a crystal growth substrate of the semiconductor device after separating the base substrate and removing the remains. Alternatively, processes of separating the base substrate and removing the remains may be carried out after depositing the semiconductor layer of the semiconductor device. Further alternatively, the semiconductor crystal A may be used as a semiconductor device without particularly carrying out the separating process and the remains removing process.

(Second Embodiment)

In the following Example, a method for producing a semiconductor crystal (crystal growth substrate) according to a second embodiment of the present invention will be described.

[1] Thin-Film Part Forming Process

In this process, a concave part forming process in which a cavity whose top is opened is formed in silicon crystal as a base substrate through physical or chemical etching treatment is carried out and then a cavity and a thin-film part are formed by migration function around the surface of the substrate owing to heat treatment at a temperature of 1000° C. to 1200° C.

(a) Forming a Concave Part on a Silicon Substrate

About 1 μm in thickness of $SiO_2$ film is formed on a Si (111) substrate by using plasma chemical vapor deposition (CVD) device, a portion of the $SiO_2$ film and the Si substrate are patterned or etched by employing photolithography and RIE, and many holes each having about 0.8 μm in diameter and about 3 μm in depth are formed on the surface of the Si (111) substrate at a period (interval) of 1.2 μm.

Then the $SiO_2$ film is removed through B—HF.

(b) Migration

Figure 2:
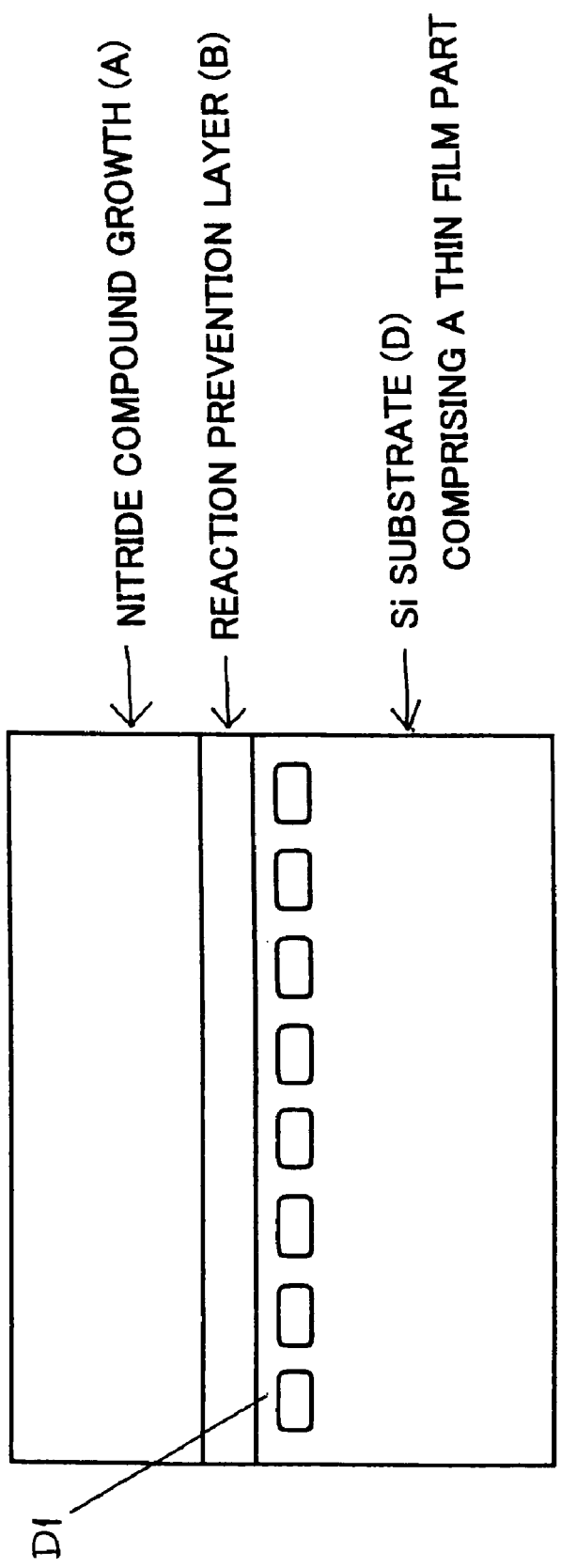
FIG. 2 is a schematic sectional view showing a method for producing a semiconductor crystal according to the second feature of the present invention.

Next, the Si substrate in which the concave parts are formed is treated by a heat treatment at a temperature of 1100° C. in the atmosphere of $H_2$ gas to migrate Si atoms at the surface of the substrate, to thereby obtain about 1 μm in thickness of thin-film part (membrane) on the upper portion of each concave part. In short, by forming the thin-film part D1 to close the upper portion of the concave part, a lot of cavities as shown in FIG. 2 are obtained. After that, the substrate is wet-oxidized at a temperature of 1150° C., its surface is changed into $SiO_2$ and the rest of the Si thin-film part becomes to have a thickness of about 0.1 μm.

(c) Washing

Then, the $SiO_2$ film is removed by employing buffered hydrofluoric acid.

By carrying out the above processes (a) to (c), a Si substrate D comprising cavities as shown in FIG. 2 and the thin-film part D1 is obtained.

[2] Reaction Prevention Layer Forming Process

A reaction prevention layer forming process is a process for depositing a reaction prevention layer on a base substrate (Si substrate D) which comprises the thin-film part D1.

In this process, first, about 1 μm in thickness of a reaction prevention layer B made of aluminum nitride (AlN) is formed at a temperature of about 1100° C. on the crystal growth plane (thin-film part D1) of the Si (111) substrate through metal organic chemical vapor deposition (MOCVD).

[3] Crystal Growing Process

In the crystal growing process, a semiconductor crystal A (GaN) is grown on the surface of the reaction prevention layer B to have a thickness of about 200 μm through metal-organic vapor phase epitaxy (hereinafter called "MOVPE").

In this process, the following gasses were employed: ammonia ($NH_3$), carrier gas ($H_2$ or $N_2$), trimethylgallium ($Ga(CH_3)_3$, hereinafter called "TMG"), and trimethylaluminum ($Al(CH_3)_3$, hereinafter called "TMA").

A GaN layer (semiconductor crystal A) is grown on the reaction prevention layer B by crystal growth through MOVPE treatment until its thickness becomes 200 μm. Crystal growth velocity of the GaN layer though MOVPE is about 301 m/Hr.

[4] Separating Process (a) After the crystal growing process, a wafer comprising the base substrate (Si substrate) is cooled to ambient temperature under conditions of supplying ammonia ($NH_3$) gas to a reaction chamber of the crystal growth apparatus. Here velocity of cooling the layers may be about −50° C./min to −5° C./min.

(b) The wafer comprising the base substrate (Si substrate) is taken from the reaction chamber of the crystal growth apparatus, and then GaN crystal (semiconductor crystal A) exfoliated (or peeled off) from the base substrate (Si substrate) is obtained. Here the crystal obtained through this process is the GaN layer (semiconductor substrate) on whose back surface rupture remains of the thin-film part D1 and sidewall of the cavities are left.

[5] Remains Removing Process

After carrying out the above separating process, rupture remains of the thin-film part D1 made of Si and sidewall of the cavities which remain on the back surface of the GaN crystal is removed through wrapping process.

Here this removing process may be carried out through etching treatment using a mixture of hydrofluoric acid and nitric acid. And the reaction prevention layer B may be also removed.

Accordingly, a GaN crystal (GaN layer) having a thickness of about 200 μm and excellent crystallinity, which is an objective free-standing semiconductor substrate (semiconductor crystal A) independent from the base substrate, was obtained through the method described above.

By employing this method for producing a semiconductor crystal, a single crystalline gallium nitride (GaN) which has more excellent crystallinity than that of a conventional one and has no GaN polycrystalline (reaction part) or no crack can be obtained.

Accordingly, by employing such an excellent single crystalline to a portion of a semiconductor light-emitting device, e.g., to a crystal growth substrate, it becomes possible or easier to produce a semiconductor product, e.g., a semiconductor light-emitting device and a semiconductor light-receiving device, which has a high luminous efficiency and whose driving voltage is more decreased compared with a conventional device.

Also, by employing such an excellent single crystalline, it becomes possible or easier to produce not only a luminous device but also semiconductor electron device such as a semiconductor power device having a high voltage-withstand-characteristic and a semiconductor high-frequency device which works to a high frequency.

Alternatively, in order to correct the mismatch of lattice constant, a buffer layer forming process in which crystal growth is carried out at a high temperature of 1000° C. to 1180° C. may be further employed between the reaction prevention layer forming process and the crystal growth process.

In the above embodiment, the thin-film part of the base substrate is obtained by forming a lot of cavities near the crystal growth plane of the base substrate as shown in FIG. 2. Alternatively, the cavities may be formed in sequence. Accordingly, in the present invention, the cavity may be formed, for example, such that one long and narrow tubular tunnel is formed elaborately in a scroll shape. FIG. 2 of this case can be interpreted as a sectional view of the base substrate comprising such a cavity.

In short, the conditions of a cavity which is objected to form the thin film part of the base substrate, such as shape, size, interval, arrangement and orientation, are generally arbitral.

(Third Embodiment)

In the present embodiment, the thin film part forming process in the second embodiment is replaced with "thin film part forming process" described below. With respect to other processes, the same processes as in the second embodiment may be carried out.

So, in this embodiment, the "thin film part forming process" which makes the third embodiment different from the second embodiment may be explained.

[1] Thin Film Part Forming Process

This process is for forming a cavity and a thin film part, comprising an ion injection process in which ion is injected into a silicon crystal providing a thin film part, a concave part forming process in which a cavity whose top is opened is formed in the silicon crystal constituting the base substrate except for the thin film part through physical or chemical etching treatment, a junction process in which the thin film part is joined to the cavity part through heat treatment, and an exfoliating process in which the thin film part is exfoliated at an ion injection part functioning as a separation front.

(a) Ion Injection Process

Hydrogen ion is injected into the silicon crystal (Si (111) substrate) which provides the thin film part D1 at a doping rate of $2 \times 10^{16}$ to $1 \times 10^{17}$ [$cm^{-2}$] and an injection energy of 4 keV.

Figure 3:
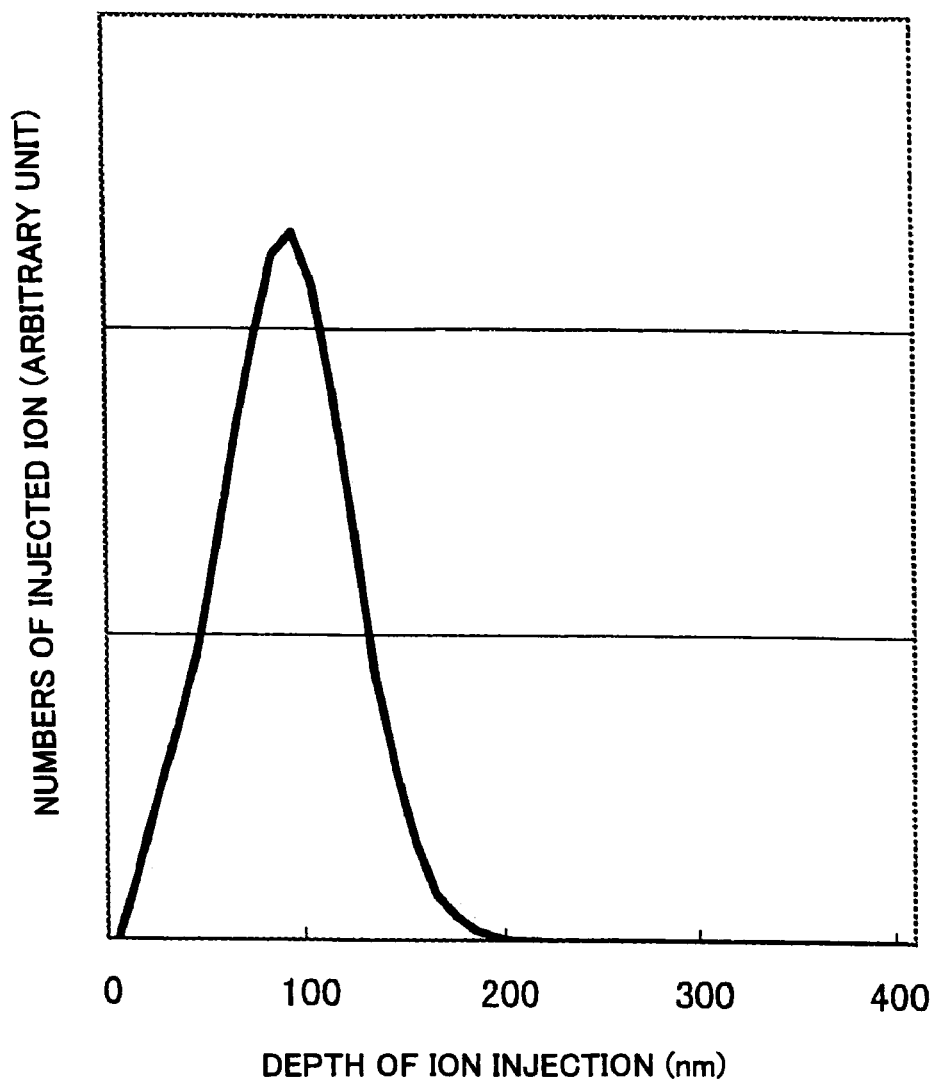
FIG. 3 is a graph showing the relationship between number (concentration) of injected ion and depth of the injected ion according to the present invention.

FIG. 3 is a graph showing the relationship between the number (concentration) of injected ion and depth of injecting ion in this embodiment. By injecting ion, as shown in FIG. 3, an ion injection layer whose ion concentration is locally high is formed around the surface of the ion injection plane of the silicon crystal.

(b) Cavity Part Forming Process

On the contrary, about 1 μm in thickness of a $SiO_2$ film is formed on another Si (111) substrate (represented by D in FIG. 2) by using plasma chemical vapor deposition (CVD) device, a portion of the $SiO_2$ film and the Si substrate are patterned or etched by employing photolithography and RIE, and many pillars each having about 0.6 μm in diameter and about 3 μm in depth are formed on the surface of the Si (111) substrate at a period (interval) of 2 μm.

(c) Junction Process

Next, the ion injection front of the silicon crystal which provides the thin film part D1 is joined vertically to the pillars formed on the surface of the Si substrate.

(d) Exfoliating Process

The silicon crystal which provides the thin film part D1 is separated at the ion injection part through heat treatment at a temperature of 500° C. and a cavity whose top is closed by the thin film part D1 is obtained.

By carrying out the above processes (a) to (d), an Si substrate D comprising cavities and the thin film part D as shown in FIG. 2 is obtained.

Then ranges for a modified embodiment of the third embodiment are explained hereinafter.

For example, helium ion ($He^+$) in place of hydrogen ion ($H^+$) may be used to obtain action and effect of the above embodiment.

Doping amount of hydrogen ion may be, although it depends on a material used to form the base layer, about $1 \times 10^{15}$ [$cm^2$] to $1 \times 10^{20}$ [$cm^2$] to obtain approximately the same action and effect as those of the above embodiment. More preferably, doping amount of hydrogen ion may be about $3 \times 10^{15}$[/$cm^2$] to $1 \times 10^{17}$[/$cm^2$], and further preferably, it may be about $8 \times 10^{15}$[/$cm^2$] to $2 \times 10^{16}$[/$cm^2$].

When doping amount of hydrogen ion is too small, it becomes difficult to securely separate the thin film part D1 from the silicon crystal which provides the thin film part D1. When doping amount of hydrogen ion is too big, the thin film part D1 may be largely damaged and it becomes difficult to separate the thin film part D1 which has a form of one sheet with substantially uniform thickness from the base substrate.

Figure 4:
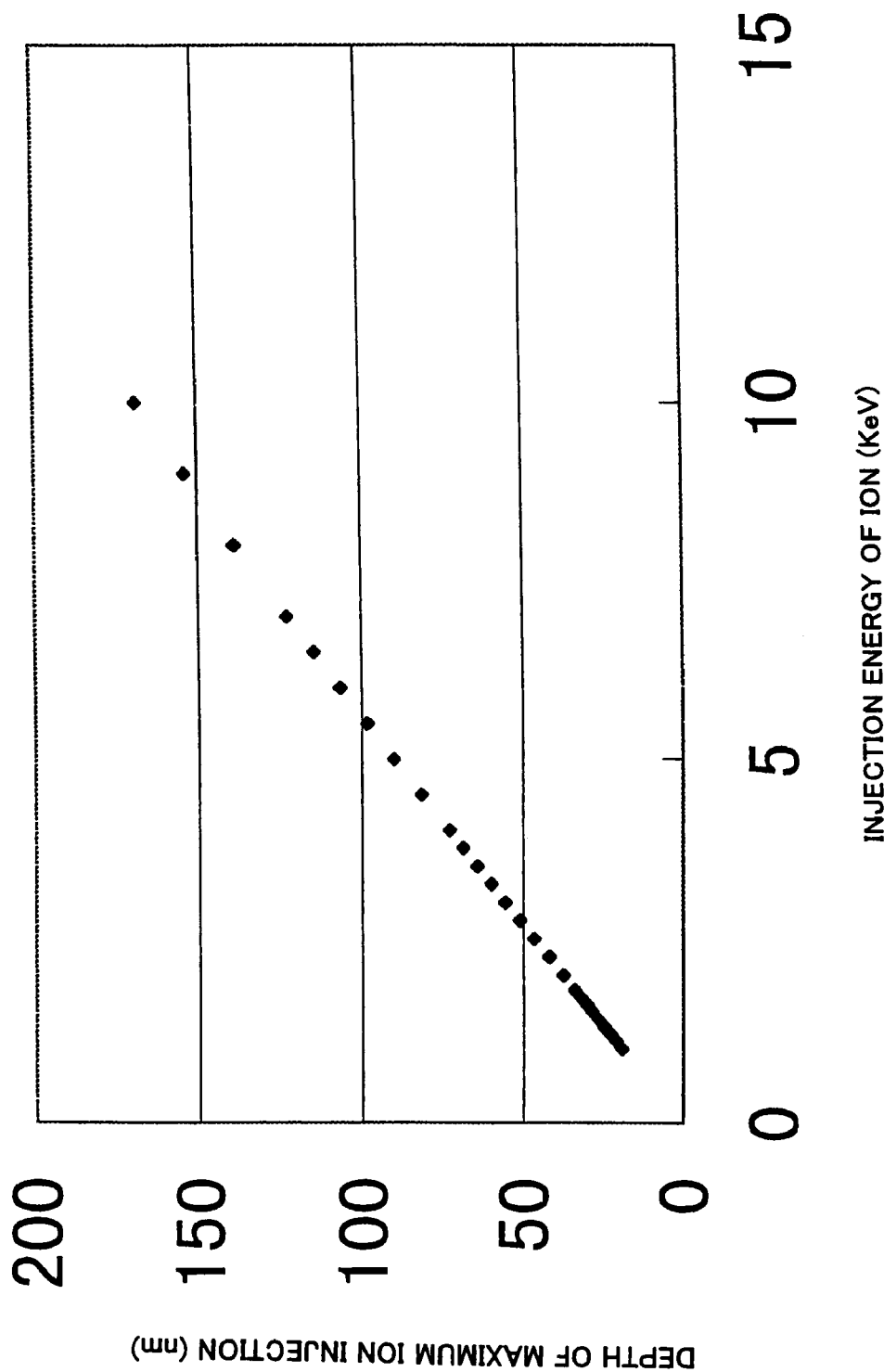
FIG. 4 is a graph showing the relationship between depth (depth h at the maximum ion concentration) of ion injection and injection energy of ion.
Figure 5:
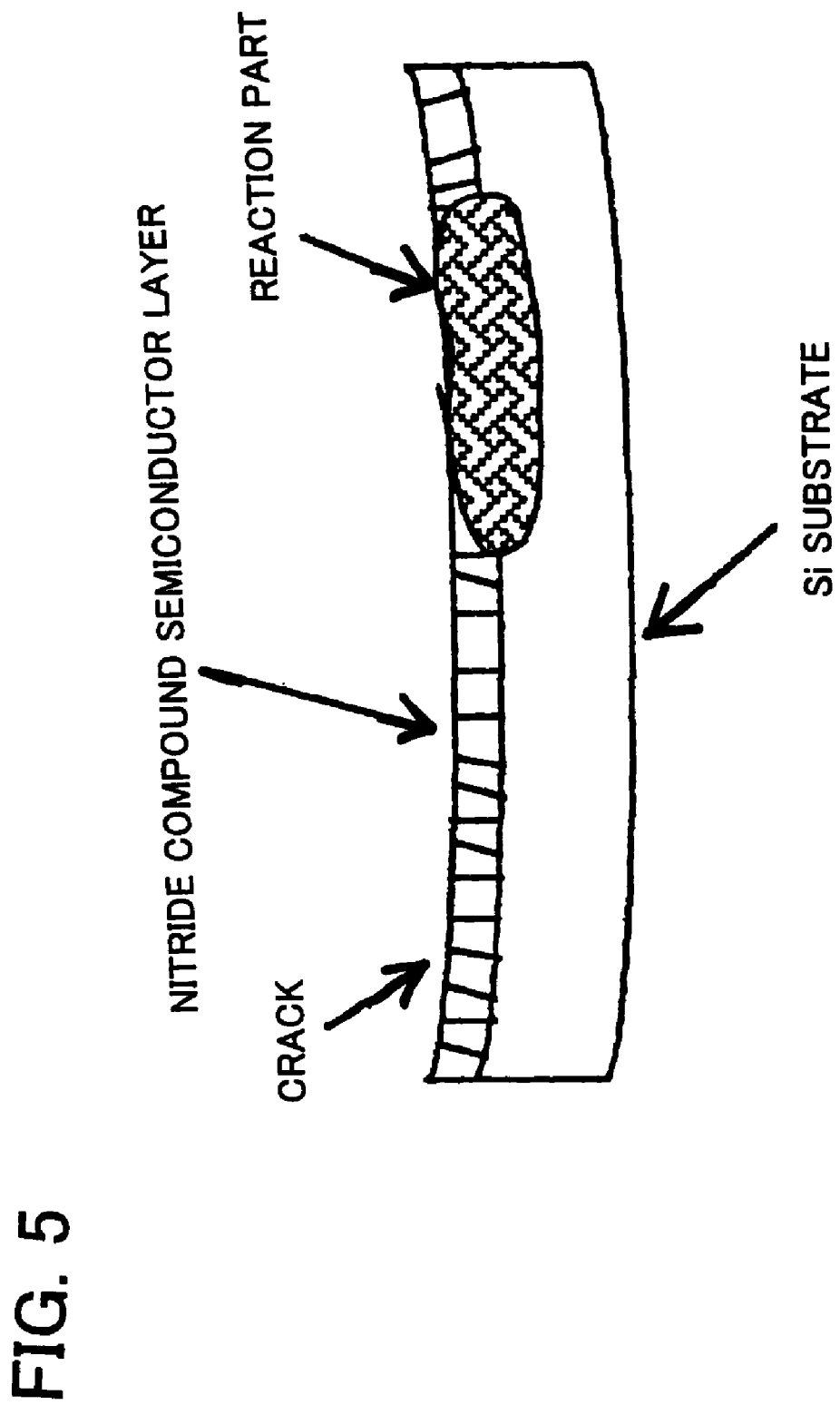
FIG. 5 is a schematic cross-sectional view showing a conventional semiconductor crystal formed on Si substrate (base substrate).

Alternatively, the thickness of the thin film part separated from the base substrate can be controlled by varying the incident energy. FIG. 4 illustrates the result of measuring depth (depth h at the maximum ion concentration) of injecting ion toward injection energy of ion. Accordingly, for example, because the depth of ion injection (depth h at the maximum ion concentration) is approximately in proportion to injection energy of ion, the thickness of the thin film part may be controlled properly by adjusting the amount of incident energy (accelerating voltage).

By carrying out heat treatment after ion injection process, a partial ruptured part (void) is formed at the ion injection layer in advance and crystallinity of the ion injection part of the base substrate, which is damaged by ion irradiation, can be recovered.

By carrying out heat treatment to the thin film part D1 in the cavity forming process, crystallinity of the semiconductor formed thereon can be improved.

Thickness of the thin film part D1 may preferably 20 μm or less. The thinner then thin film part is, the more tensile stress toward the objective grown semiconductor crystal is relaxed, and that can decrease generation of dislocations or cracks in the objective grown semiconductor crystal. More preferably, thickness of the thin film part may be 2 μm or less, and further preferably, 200 nm or less. In order to obtain the thin film part having such an optimum thickness, ion injection energy (accelerating voltage) may be controlled in accordance with the graph in FIG. 4 so that the depth when the numbers of injected ion becomes its peak corresponds to the desired thickness of the thin film part.

When the ion injection layer becomes too thick, it becomes difficult to control thickness of the thin film part. So thickness of the ion injection layer has to be determined carefully.

Although thickness of the ion injection layer cannot be strictly defined, the full width half maximum in the characteristics of the numbers of injected ion in FIG. 3, for example, may be used as one standard. The thinner the ion injection layer is, the easier the thickness of the thin film part of the base substrate becomes to be controlled.

Accordingly, in order to control thickness of the thin film part precisely, a method for keeping the energy of ion injection (accelerating voltage) constant as much as possible may be useful.

Alternatively, in the second embodiment and each embodiment following the second embodiment, materials such as $Al_xGa_{1-x}N$ (0<x<1) may be used as monocrystalline material B for forming the reaction prevention layer to obtain approximately same action and effect as in the above embodiments. More generally, silicon carbide (SiC), aluminum nitride (AlN), spinel ($MgAl_2O_4$), or AlGaN, AlInN and AlGaInN whose aluminum composition ratio is at least 0.30 and more may be used as monocrystalline material B forming the reaction prevention layer.

The semiconductor crystal A which forms an objective semiconductor substrate is not limited to gallium nitride (GaN) but may be selected from the above-mentioned group III nitride compound semiconductor.

Alternatively, the objective semiconductor substrate (semiconductor crystal A) may have a multiple layer structure.

In short, in the present invention, kinds (materials) of the base substrate and the objective semiconductor crystal have no special limitation. So the present invention, including the above-described arbitrary combination of each material of the base substrate and the semiconductor crystal, can be applied to well-known and arbitral kind of hetero epitaxial growth.

Metal-organic vapor phase epitaxly (MOVPE) is employed in the above embodiment. Alternatively, crystal growth of the present invention may be carried out through halide vapor phase growth (HVPE).

Further, in the above embodiment, the semiconductor crystal A is employed as a crystal growth substrate of the semiconductor device after separating the base substrate and removing the remains. Alternatively, processes of separating the base substrate and removing the remains may be carried out after depositing the semiconductor layer of the semiconductor device. Further alternatively, the semiconductor crystal A may be used as a semiconductor device without particularly carrying out the separating process and the remains removing process.

While the present invention has been described with reference to the above embodiments as the most practical and optimum ones, the present invention is not limited thereto, but may be modified as appropriate without departing from the spirit of the invention.

What is claimed is:

1. A method for producing a semiconductor substrate in which a semiconductor crystal A comprising a Group III nitride compound semiconductor is grown on a base substrate comprising silicon (Si), said method comprising:

a sacrifice layer forming process in which a sacrifice layer made of approximately the same kind of semiconductor as said semiconductor crystal A is formed on said base substrate by crystal growth;

a reaction prevention layer forming process in which a reaction prevention layer made of a monocrystalline material B whose melting point or thermal stability is higher than that of said semiconductor crystal A and preventing silicon (Si) from diffusing is deposited on said sacrifice layer; and a crystal growth process for growing a semiconductor substrate made of said semiconductor crystal A on said reaction prevention layer by crystal growth.

2. A method for producing a semiconductor substrate according to claim 1, wherein said semiconductor crystal A comprises a group III nitride compound semiconductor having a composition of $Al_xGa_yIn_{(1-x-y)}N$ ($0 \leq x < 0.9$, $0.1 < y \leq 1$, $0 < x+y \leq 1$).

3. A method for producing a semiconductor substrate according to claim 1, wherein at least one of silicon carbide (SiC), aluminum nitride (AlN), and spinel ($MgAl_2O_4$) is used as monocrystalline material B forming said reaction prevention layer.

4. A method for producing a semiconductor substrate according to claim 2, wherein at least one of silicon carbide (SiC), aluminum nitride (AlN), and spinel ($MgAl_2O_4$) is used as monocrystalline material B forming said reaction prevention layer.

5. A method for producing a semiconductor substrate according to claim 1, wherein AlGaN, AlInN, or AlGaInN, in which an aluminum composition ratio is at least 0.30 or more, is used as monocrystalline material B forming said reaction prevention layer.

6. A method for producing a semiconductor substrate according to claim 2, wherein AlGaN, AlInN, or AlGaInN, in which an aluminum composition ratio is at least 0.30 or more, is used as monocrystalline material B forming said reaction prevention layer.

7. A method for producing a semiconductor substrate according to claim 1, wherein a thickness of said reaction prevention layer is in a range of 0.1 mm to 2 mm.

8. A method for producing a semiconductor substrate according to claim 2, wherein a thickness of said reaction prevention layer is in a range of 0.1 mm to 2 mm.

9. A method for producing a semiconductor substrate according to claim 1, wherein two or more reaction prevention layers are deposited.

10. A method for producing a semiconductor substrate according to claim 2, wherein two or more reaction prevention layers are deposited.

11. A method for producing a semiconductor substrate according to claim 1, wherein a buffer layer C made of $Al_xGa_{1-x}N$ ($0 < x \leq 1$) is formed directly on said base substrate or said reaction prevention layer.

12. A method for producing a semiconductor substrate according to claim 11, wherein a buffer layer C made of $Al_xGa_{1-x}N$ ($0 < x \leq 1$) is formed directly on said base substrate or said reaction prevention layer.

13. A method for producing a semiconductor substrate according to claim 11, wherein two or more buffer layers C are formed.

14. A method for producing a semiconductor substrate according to claim 12, wherein two or more buffer layers C are formed.

15. A method for producing a semiconductor substrate according to claim 11, wherein said buffer layer C is formed to have a thickness of 0.01 mm to 1 mm.

16. A method for producing a semiconductor substrate according to claim 1, wherein said buffer layer C is formed to have a thickness of 0.01 mm to 1 mm.

17. A method for producing a semiconductor substrate according to claim 1, wherein said semiconductor crystal A is deposited to have a thickness of 50 mm or more in said crystal growing process.

18. A method for producing a semiconductor substrate according to claim 2, wherein said semiconductor crystal A is deposited to have a thickness of 50 mm or more in said crystal growing process.

19. A method for producing a semiconductor substrate in which a semiconductor crystal A comprising a Group III nitride compound semiconductor is grown on a base substrate comprising silicon (Si), said method comprising:

a thin film part forming process in which a thin film part made of silicon (Si) is formed as a crystal growth front of said base substrate by forming a cavity right under said crystal growth front of said base substrate;

a reaction prevention layer forming process in which a reaction prevention layer made of a monocrystalline material B whose melting point or thermal stability is higher than that of said semiconductor crystal A is deposited on said thin film part; and a crystal growing process for growing said semiconductor crystal A on said reaction prevention layer by crystal growth.

wherein said cavity is separated into a plurality of cavities which are independent with each other on an upper side of said base substrate.

20. A method for producing a semiconductor substrate according to claim 19, wherein said semiconductor crystal A comprises a group III nitride compound semiconductor having a composition of $Al_xGa_yIn_{(1-x-y)}N$ ($0 \leq x < 1$, $0 < y \leq 1$, $0 < x+y \leq 1$).

21. A method for producing a semiconductor substrate according to claim 19, wherein at least one of silicon carbide (SiC), aluminum nitride (AlN), and spinel ($MgAl_2O4$) is used as monocrystalline material B forming said reaction prevention layer.

22. A method for producing a semiconductor substrate according to claim 20, wherein at least one of silicon carbide (SiC), aluminum nitride (AlN), and spinel ($MgAl_2O_4$) is used as monocrystalline material B forming said reaction prevention layer.

23. A method for producing a semiconductor substrate according to claim 19, wherein AlGaN, AlInN, or AlGaInN, in which an aluminum composition ratio is at least 0.30 or more, is used as monocrystalline material B forming said reaction prevention layer.

24. A method for producing a semiconductor substrate according to claim 20, wherein AlGaN, AlInIN, or AlGaInN, in which an aluminum composition ratio is at least 0.30 or more, is used as monocrystalline material B forming said reaction prevention layer.

25. A method for producing a semiconductor substrate according to claim 19, wherein a thickness of said reaction prevention layer is in a range of 0.1 mm to 2 mm.

26. A method for producing a semiconductor substrate according to claim 20, wherein a thickness of said reaction prevention layer is in a range of 0.1 mm to 2 mm.

27. A method for producing a semiconductor substrate according to claim 19, further comprising a reaction prevention layer forming process wherein a buffer layer C made of $Al_xGa_{1-x}N$ ($0 < x \leq 1$) is formed on said reaction prevention layer after said reaction prevention layer forming process.

28. A method for producing a semiconductor substrate according to claim 20, further comprising a reaction prevention layer forming process wherein a buffer layer C made of $Al_xGa_{1-x}N$ ($0 < x \leq 1$) is formed on said reaction prevention layer after said reaction prevention layer forming process.

29. A method for producing a semiconductor substrate according to claim 27, wherein said buffer layer C is formed to have a thickness of 0.01 mm to 1 mm.

30. A method for producing a semiconductor substrate according to claim 28, wherein said buffer layer C is formed to have a thickness of 0.01 mm to 1 mm.

31. A method for producing a semiconductor substrate according to claim 19, further comprising a separation process for separating said semiconductor crystal A and said base substrate, wherein stress owing to differences of thermal expansion coefficients is generated by cooling or heating said substrate crystal A and said base substrate, and sidewalls of said cavity is broken by using said stress.

32. A method for producing a semiconductor substrate according to claim 20, further comprising a separation process for separating said semiconductor crystal A and said base substrate, wherein stress owing to differences of thermal expansion coefficients is generated by cooling or heating said substrate crystal A and said base substrate, and sidewalls of said cavity is broken by using said stress.

33. A method for producing a semiconductor substrate according to claim 19, wherein said semiconductor crystal A is deposited to have a thickness of 50 mm or more in said crystal growing process.

34. A method for producing a semiconductor substrate according to claim 20, wherein said semiconductor crystal A is deposited to have a thickness of 50 mm or more in said crystal growing process.

35. A method for producing a semiconductor substrate according to claim 19, said thin film part forming process comprising:
    a concave part forming process in which a cavity whose top is opened is formed in said silicon crystal constituting said base substrate through physical or chemical etching treatment is carried out;
    wherein a cavity and said thin film part are formed by migration function around said surface of said substrate owing to heat treatment at a temperature of 1000° C. to 1350° C.

36. A method for producing a semiconductor substrate according to claim 20, said thin film part forming process comprising:
    a concave part forming process in which a cavity whose top is opened is formed in said silicon crystal constituting said base substrate through physical or chemical etching treatment is carried out;
    wherein a cavity and said thin film part are formed by migration function around said surface of said substrate owing to heat treatment at a temperature of 1000° C. to 1350° C.

37. A method for producing a semiconductor substrate according to claim 19, said thin film part forming process comprising: an ion injecting process in which ion is injected into said silicon crystal forming said thin film part;
    a concave part forming process in which a cavity whose top is opened is formed in said silicon crystal comprising said base substrate except for said thin film part through physical or chemical etching treatment;
    a junction process in which said thin film part is joined to said cavity part through heat treatment; and
    an exfoliating process in which said thin film part is exfoliated at an ion injection part functioning as a separation front.

38. A method for producing a semiconductor substrate according to claim 20, said thin film part forming process comprising:
    an ion injecting process in which ion is injected into said silicon crystal forming said thin film part;
    a concave part forming process in which a cavity whose top is opened is formed in said silicon crystal comprising said base substrate except for said thin film part through physical or chemical etching treatment;
    a junction process in which said thin film part is joined to said cavity part through heat treatment; and
    an exfoliating process in which said thin film part is exfoliated at an ion injection part functioning as a separation front.

39. A method for producing a semiconductor substrate according to claim 19, wherein a height of said cavity is 0.1 mm to 10 mm in said thin film part forming process.

40. A method for producing a semiconductor substrate according to claim 20, wherein a height of said cavity is 0.1 mm to 10 mm in said thin film part forming process.

* * * * *